(12) United States Patent
Tanoue et al.

(10) Patent No.: US 12,070,820 B2
(45) Date of Patent: Aug. 27, 2024

(54) PROCESSING APPARATUS AND PROCESSING METHOD

(71) Applicant: Tokyo Electron Limited, Tokyo (JP)

(72) Inventors: Hayato Tanoue, Kumamoto (JP); Yohei Yamashita, Kumamoto (JP); Hirotoshi Mori, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 397 days.

(21) Appl. No.: 17/627,707

(22) PCT Filed: Jul. 9, 2020

(86) PCT No.: PCT/JP2020/026878
§ 371 (c)(1),
(2) Date: Jan. 17, 2022

(87) PCT Pub. No.: WO2021/010284
PCT Pub. Date: Jan. 21, 2021

(65) Prior Publication Data
US 2022/0250191 A1  Aug. 11, 2022

(30) Foreign Application Priority Data
Jul. 18, 2019 (JP) .................. 2019-133087

(51) Int. Cl.
*B23K 26/53* (2014.01)
*B23K 26/062* (2014.01)
(Continued)

(52) U.S. Cl.
CPC ............ *B23K 26/53* (2015.10); *B23K 26/062* (2015.10); *H01L 21/304* (2013.01); *H01L 21/67092* (2013.01)

(58) Field of Classification Search
CPC ............ H01L 21/304; H01L 21/67092; H01L 21/02002; H01L 21/268; B23K 26/53;
(Continued)

(56) References Cited

U.S. PATENT DOCUMENTS

2020/0411338 A1* 12/2020 Mori .................. B23K 26/53

FOREIGN PATENT DOCUMENTS

| JP | 2015032690 A | 2/2015 |
| JP | 2016215231 A | 12/2016 |
| WO | 2019044588 A1 | 3/2019 |

OTHER PUBLICATIONS

International Search Report of PCT/JP2020/026878 dated Oct. 6, 2020.

* cited by examiner

*Primary Examiner* — Marc Anthony Armand
(74) *Attorney, Agent, or Firm* — Shih IP Law Group, PLLC.

(57) ABSTRACT

A processing apparatus includes a controller configured to control an operation of forming condensing points in a processing target object. In forming the condensing points by radiating a laser light to an inside of the processing target object periodically from a modifying device while rotating the processing target object held by a holder relative to the modifying device by a rotating mechanism and, also, by moving the modifying device in a diametrical direction relative to the holder by a moving mechanism, the controller controls a number and an arrangement of the condensing points, which are simultaneously formed at different positions in a plane direction of the processing target object, based on a relative rotation number of the processing target object and a radiation pitch of the laser light.

16 Claims, 15 Drawing Sheets

(51) Int. Cl.
*H01L 21/304* (2006.01)
*H01L 21/67* (2006.01)

(58) Field of Classification Search
CPC .... B23K 26/062; B23K 26/08; B23K 26/402; B23K 26/702
See application file for complete search history.

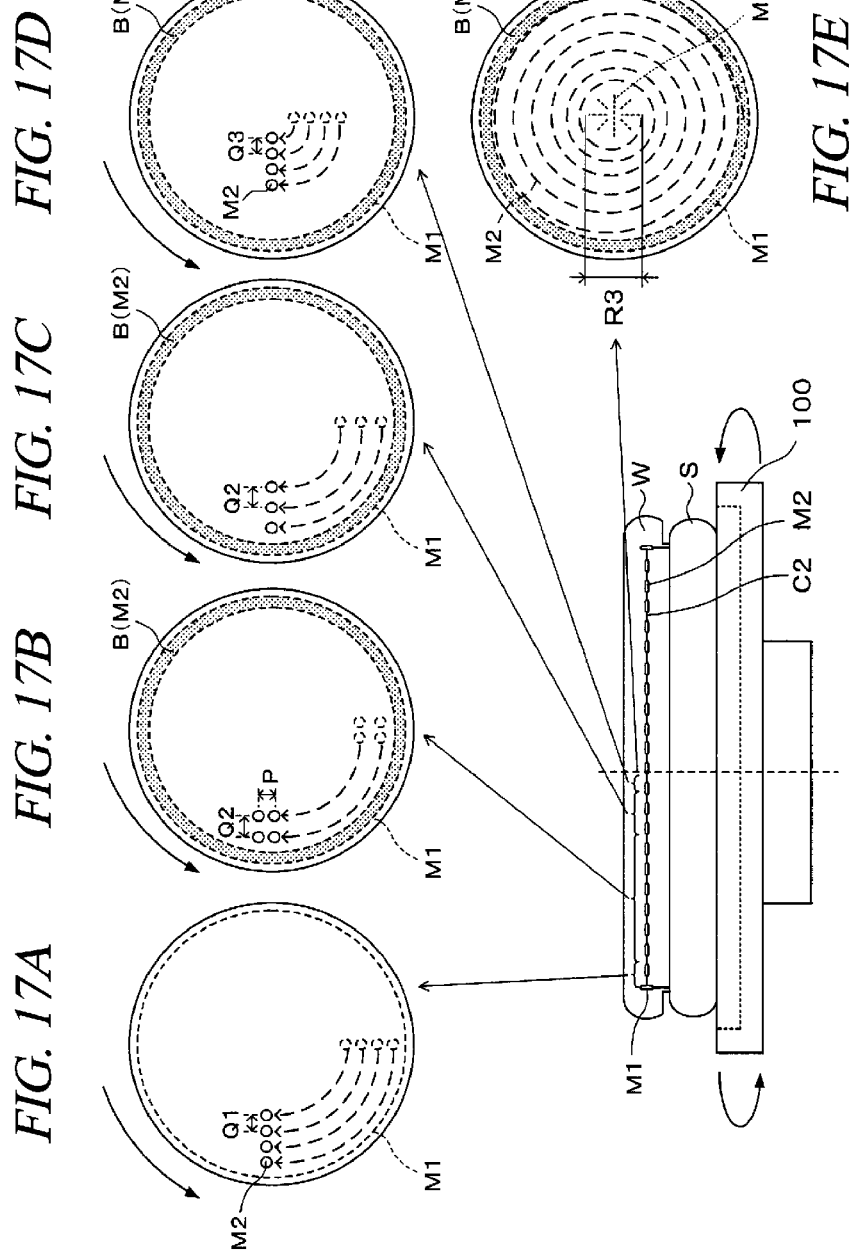

PROCESSING APPARATUS AND PROCESSING METHOD

CROSS-REFERENCE TO RELATED APPLICATIONS

This Application is a U.S. national phase application under 35 U.S.C. § 371 of PCT Application No. PCT/JP2020/026878 filed on Jul. 9, 2020, which claims the benefit of Japanese Patent Application No. 2019-133087 filed on Jul. 18, 2019, the entire disclosures of which are incorporated herein by reference.

TECHNICAL FIELD

The various aspects and embodiments described herein pertain generally to a processing apparatus and a processing method.

BACKGROUND

Patent Document 1 discloses a processing method for a stacked wafer. According to Patent Document 1, the processing method includes a modification surface forming process of forming a modification surface within the stacked wafer and a separating process of separating a part of a first wafer from the stacked wafer along the modification surface as a boundary.

PRIOR ART DOCUMENT

Patent Document 1: Japanese Patent Laid-open Publication No. H2015-032690

DISCLOSURE OF THE INVENTION

Means for Solving the Problems

In an exemplary embodiment, a processing apparatus configured to process a processing target object includes a holder configured to hold the processing target object; a modifying device configured to form multiple condensing points along a plane direction of the processing target object by radiating laser light to an inside of the processing target object; a moving mechanism configured to move the holder and the modifying device in a horizontal direction relative to each other; a rotating mechanism configured to rotate the holder and the modifying device relative to each other; and a controller configured to control an operation of forming the condensing points in the processing target object. In forming the condensing points by radiating the laser light to the inside of the processing target object periodically from the modifying device while rotating the processing target object held by the holder relative to the modifying device by the rotating mechanism and, also, by moving the modifying device in a diametrical direction relative to the holder by the moving mechanism, the controller controls a number and an arrangement of the condensing points, which are simultaneously formed at different positions in the plane direction of the processing target object, based on a relative rotation number of the processing target object and a radiation pitch of the laser light.

BRIEF DESCRIPTION OF THE DRAWINGS

FIG. 17A to FIG. 17E are explanatory diagrams illustrating the example of the internal modification layer forming process according to the exemplary embodiment.

DETAILED DESCRIPTION

Figure 1:
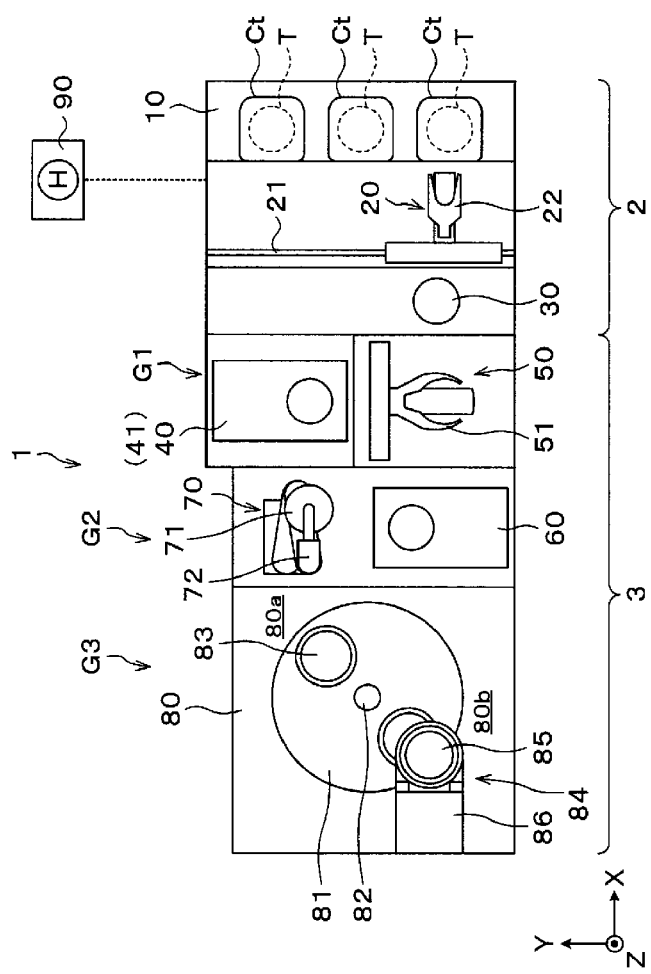
FIG. 1 is a plan view schematically illustrating a configuration example of a wafer processing system.

In a manufacturing process for a semiconductor device, a semiconductor wafer (hereinafter, simply referred to as a wafer) such as a circular substrate having a plurality of devices such as electronic circuits formed on a surface thereof is thinned by radiating laser light to an inside of the wafer to form a modification layer and separating the wafer by using the modification layer as a starting point, as described in Patent Document 1, for example.

For such wafer separation, after the modification layer is formed within the wafer, a tensile force in a detaching direction is applied while holding a front side and a rear side of the wafer. Accordingly, the wafer is separated and thinned using the formed modification layer and cracks propagating from the modification layer as a boundary. In the following description, among separated wafers, the wafer on the front side where the devices are formed will be sometimes referred to as a "first separation wafer," and the wafer on the rear side, as a "second separation wafer".

Here, in the modification surface forming process described in Patent Document 1, a laser beam radiated from a laser beam radiating device is focused on one point within the first wafer, and a modification surface is formed at this condensing point (single-focusing processing).

When performing the single focus processing in the entire surface of the wafer as stated above, that is, when forming the modification layers one by one in the entire surface of the wafer, productivity (tact) is reduced in a modifying apparatus which forms the modification layers. That is, since the modification layers are formed one by one, it takes time to complete the formation of the modification layers, resulting in reduction of throughput in the modifying apparatus. In this regard, there is a room for improvement in the formation of the modification layers.

The present disclosure provides a technique enabling to improve efficiency of a separating processing for a processing target object. Hereinafter, a wafer processing system equipped with a processing apparatus according to an exemplary embodiment and a wafer processing method as a processing method will be described with reference to the accompanying drawings. In the present specification and the drawings, parts having substantially the same functions and configurations will be assigned same reference numerals, and redundant description thereof will be omitted.

First, a configuration of the wafer processing system will be discussed. FIG. 1 is a plan view schematically illustrating a configuration of a wafer processing system 1.

Figure 2:
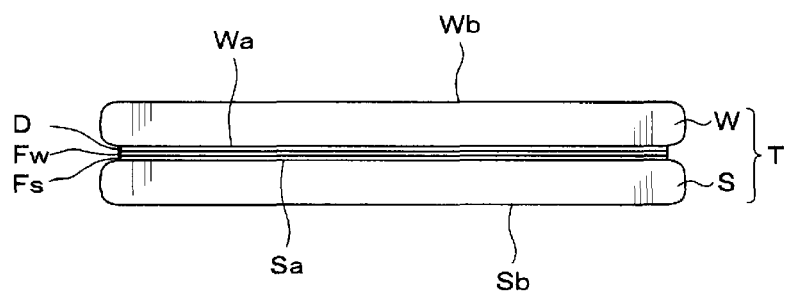
FIG. 2 is a side view schematically illustrating an example structure of a combined wafer.

The wafer processing system 1 is configured to perform a processing on a combined wafer T in which a processing target wafer W and a support wafer S are bonded to each other as illustrated in FIG. 2. In the wafer processing system 1, the processing target wafer W is separated and thinned. Hereinafter, in the processing target wafer W, a surface bonded to the support wafer S will be referred to as a front surface Wa, and a surface opposite to the front surface Wa will be referred to as a rear surface Wb. Likewise, in the support wafer S, a surface bonded to the processing target wafer W will be referred to as a front surface Sa, and a surface opposite to the front surface Sa will be referred to as a rear surface Sb. Further, in the present exemplary embodiment, the processing target wafer W corresponds to a processing target object of the present disclosure.

The processing target wafer W is a semiconductor wafer such as, but not limited to, a silicon wafer having a circular plate shape, and it has, on the front surface Wa thereof, a device layer D including a plurality of devices such as electronic circuits. Further, an oxide film Fw, for example, a $SiO_2$ film (TEOS film) is further formed on the device layer D. In the present exemplary embodiment, the processing target wafer W constitutes the aforementioned wafer as the target of separation.

The support wafer S is a wafer that supports the processing target wafer W. An oxide film Fs, for example, a $SiO_2$ film (TEOS film) is formed on the front surface Sa of the support wafer S. Further, if the support wafer S has a plurality of devices formed on the front surface Sa thereof, a device layer (not shown) is formed on the front surface Sa, the same as in the processing target wafer W.

Further, in the following description, illustration of the device layer D and the oxide films Fw and Fs may be omitted in some cases for the simplicity of illustration.

Figure 3:
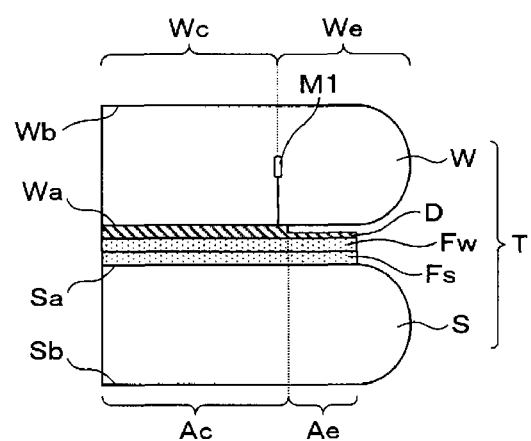
FIG. 3 is a side view schematically illustrating an example structure of a part of the combined wafer.

Further, in addition to the above-stated thinning processing, an edge trimming processing is further performed on the processing target wafer W to suppress a peripheral portion of the processing target wafer W from having a sharp pointed shape (a so-called knife edge shape) by the thinning processing. In the edge trimming processing, as shown in FIG. 3, a peripheral modification layer M1 is formed by radiating laser light to a boundary between a peripheral portion We as a removing target and a central portion Wc, and the peripheral portion We is removed starting from this peripheral modification layer M1. Further, the peripheral portion We to be removed by the edge trimming may range from, e.g., 1 mm to 5 mm from an edge of the processing target wafer W in a diametrical direction thereof. A method of the edge trimming processing will be described later.

Here, if the processing target wafer W and the support wafer S are bonded in the peripheral portion We of the processing target wafer W, there is a likelihood that the peripheral portion We may not be removed appropriately. For the reason, a non-bonding region Ae for appropriately performing the edge trimming is formed at an interface between the processing target wafer W and the support wafer S in a portion corresponding to the peripheral portion We as the removal target in the edge trimming. Specifically, as shown in FIG. 3, a bonding region Ac in which the processing target wafer W and the support wafer S are bonded and the non-bonding region Ae in which bonding strength between the processing target wafer W and the support wafer S is reduced are formed at the interface between the processing target wafer W and the support wafer S. Further, it is desirable that an outer end of the bonding region Ac is located slightly outer than an inner end of the peripheral portion We to be removed.

The non-bonding region Ae may be formed before the bonding, for example. Specifically, by removing a bonding interface of the processing target wafer W before being subjected to the bonding through polishing or wet etching, by modifying the bonding interface through radiation of laser light thereto, or by hydrophobizing the bonding interface through application of a hydrophobic material thereon, the bonding strength is reduced to form the non-bonding region Ae. Further, the "bonding interface" where the non-bonding region Ae is formed refers to a portion of the processing target wafer W forming an interface to be actually bonded to the support wafer S.

The non-bonding region Ae may be formed after the bonding, for example. Specifically, by radiating laser light to the interface in a portion corresponding to the peripheral portion We of the processing target wafer W after the bonding, the bonding strength for the front surface Sa of the support wafer S is reduced, so that the non-bonding region Ae is formed. In addition, the non-bonding region Ae may be formed at any position in the vicinity of the bonding interface between the processing target wafer W and the support wafer S as long as a bonding force between the processing target wafer W and the support wafer S in the peripheral portion of the processing target wafer W can be appropriately reduced. That is, it is assumed that the "vicinity of the bonding interface" according to the present exemplary embodiment includes the inside of the processing target wafer W, the inside of the device layer D, the inside of an oxide film Fw, and so forth.

As depicted in FIG. 1, the wafer processing system 1 includes a carry-in/out station 2 and a processing station 3 connected as one body. In the carry-in/out station 2, a cassette Ct capable of accommodating therein a multiple number of combined wafers T is carried to/from the outside, for example. The processing station 3 is equipped with various kinds of processing apparatuses configured to perform required processings on the combined wafers T.

A cassette placing table 10 is provided in the carry-in/out station 2. In the shown example, a plurality of, for example, three cassettes Ct can be arranged on the cassette placing table 10 in a row in the Y-axis direction. Further, the number of the cassettes Ct placed on the cassette placing table 10 is not limited to the example of the present exemplary embodiment but can be selected as required.

In the carry-in/out station 2, a wafer transfer device 20 is provided adjacent to the cassette placing table 10 at a negative X-axis side of the cassette placing table 10. The wafer transfer device 20 is configured to be movable on a transfer path 21 which is elongated in the Y-axis direction. Further, the wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the exemplary embodiment, and various other configurations may be adopted. The wafer transfer device 20 is configured to be capable of transferring the combined wafer T to/from the cassette Ct of the cassette placing table 10 and a transition device 30 to be described later.

In the carry-in/out station 2, the transition device 30 configured to deliver the combined wafer T is provided adjacent to the wafer transfer device 20 at a negative X-axis side of the wafer transfer device 20.

The processing station 3 is provided with, for example, three processing blocks G1 to G3. The first processing block G1, the second processing block G2 and the third processing block G3 are arranged side by side in this sequence from a positive X-axis side (from the carry-in/out station 2 side) toward a negative X-axis side.

The first processing block G1 is equipped with an etching apparatus 40, a cleaning apparatus 41, and a wafer transfer device 50. The etching apparatus 40 and the cleaning apparatus 41 are stacked on top of each other. Further, the number and the layout of the etching apparatus 40 and the cleaning apparatus 41 are not limited to the shown example. By way of example, the etching apparatus 40 and the cleaning apparatus 41 may be arranged side by side in the X-axis direction. Further, a plurality of etching apparatuses 40 and a plurality of cleaning apparatuses 41 may be respectively stacked on top of each other.

The etching apparatus 40 is configured to etch a separated surface of the processing target wafer W grounded by a processing apparatus 80 to be described later. By way of example, by supplying a chemical liquid (etching liquid) onto the separated surface, this separated surface is wet-etched. For instance, HF, $HNO_3$, $H_3PO_4$, TMAH, Choline, KOH, or the like may be used as the chemical liquid.

The cleaning apparatus 41 is configured to clean the separated surface of the processing target wafer W grounded by the processing apparatus 80 to be described later. By way of example, by bringing a brush into contact with the separated surface, the separated surface is cleaned by being scrubbed. Furthermore, a pressurized cleaning liquid may be used for the cleaning of the separated surface. In addition, the cleaning apparatus 41 may be configured to clean the rear surface Sb of the support wafer S as well as the separated surface of the processing target wafer W.

The wafer transfer device 50 is disposed at, for example, a negative Y-axis side of the etching apparatus 40 and the cleaning apparatus 41. The wafer transfer device 50 has, for example, two transfer arms 51 each of which is configured to hold and transfer the combined wafer T. Each transfer arm 51 is configured to be movable in a horizontal direction and a vertical direction and pivotable around a horizontal axis and a vertical axis. Further, the configuration of the transfer arm 51 is not limited to the exemplary embodiment, and various other configurations may be adopted. Additionally, the wafer transfer device 50 is configured to be capable of transferring the combined wafer T to/from the transition device 30, the etching apparatus 40, the cleaning apparatus 41 and a modifying apparatus 60 to be described later.

The second processing block G2 is equipped with the modifying apparatus 60 and a wafer transfer device 70. The number and the layout of the modifying apparatus 60 is not limited to the example of the present exemplary embodiment, and a plurality of modifying apparatuses 60 may be stacked.

The modifying apparatus 60 is configured to form the non-bonding region Ae, the peripheral modification layer M1, an internal modification layer M2, and a central modification layer M3 by radiating laser light to an inside of the processing target wafer W. A specific configuration of the modifying apparatus 60 will be elaborated later.

The wafer transfer device 70 is disposed at, for example, a positive Y-axis side of the modifying apparatus 60. The wafer transfer device 70 is equipped with, for example, two transfer arms 71 each of which is configured to hold and transfer the combined wafer T. Each transfer arm 71 is supported at a multi-joint arm member 72 and configured to be movable in a horizontal direction and a vertical direction and pivotable around a horizontal axis and a vertical axis. Further, the configuration of the transfer arm 71 is not limited to the example of the present exemplary embodiment, and may vary as required. The wafer transfer device 70 is configured to be capable of transferring the combined wafer T to/from the cleaning apparatus 41, the modifying apparatus 60, and the processing apparatus 80 to be described later.

The third processing block G3 is equipped with the processing apparatus 80. The number and the layout of the processing apparatus 80 is not limited to the example of the present exemplary embodiment, and a plurality of processing apparatuses 80 may be arranged as required.

The processing apparatus 80 has a rotary table 81. The rotary table 81 is configured to be rotatable about a vertical rotation center line 82 by a rotation mechanism (not shown). Two chucks 83 each configured to attract and hold the combined wafer T are provided on the rotary table 81. The chucks 83 are arranged on a circle concentric with the rotary table 81 in a uniform manner. The two chucks 83 are configured to be moved to a delivery position 80a and a processing position 80b as the rotary table 81 is rotated. Further, each of the two chucks 83 is configured to be rotatable around a vertical axis by a rotating mechanism (not shown).

At the delivery position 80a, delivery of the combined wafer T is performed. The grinding unit 84 is disposed at the processing position 80b to grind the processing target wafer W. The grinding unit 84 is equipped with a grinder 85 having a grinding whetstone (not shown) configured to be rotated in a ring shape. Further, the grinder 85 is configured to be movable in a vertical direction along a supporting column 86. While keeping the processing target wafer W held by the chuck 83 in contact with the grinding whetstone, the chuck 83 and the grinding whetstone are respectively rotated.

The above-described wafer processing system 1 is equipped with a control device 90 as a controller. The control device 90 is implemented by, for example, a computer equipped with a CPU, a memory, and so forth, and includes a program storage (not shown). A program for controlling a processing of the processing target wafer W in the wafer processing system 1 is stored in the program storage. Further, the program storage also stores therein a program for implementing a wafer processing to be described later in the wafer processing system 1 by controlling the above-described various processing apparatuses and a driving system such as the transfer devices. Further, the programs may be recorded in a computer-readable recording medium H, and may be installed from this recording medium H to the control device 90.

Moreover, the aforementioned various processing apparatus may be further equipped with control devices (not shown) respectively configured to control the various processing apparatuses independently.

Figure 4:
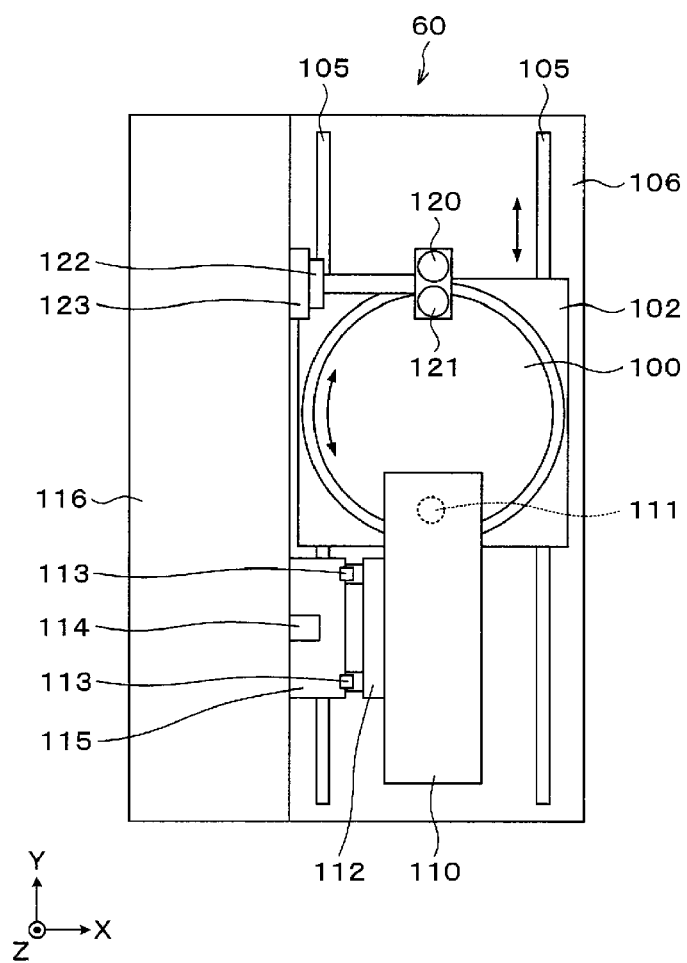
FIG. 4 is a plan view schematically illustrating a configuration example of a modifying apparatus.
Figure 5:
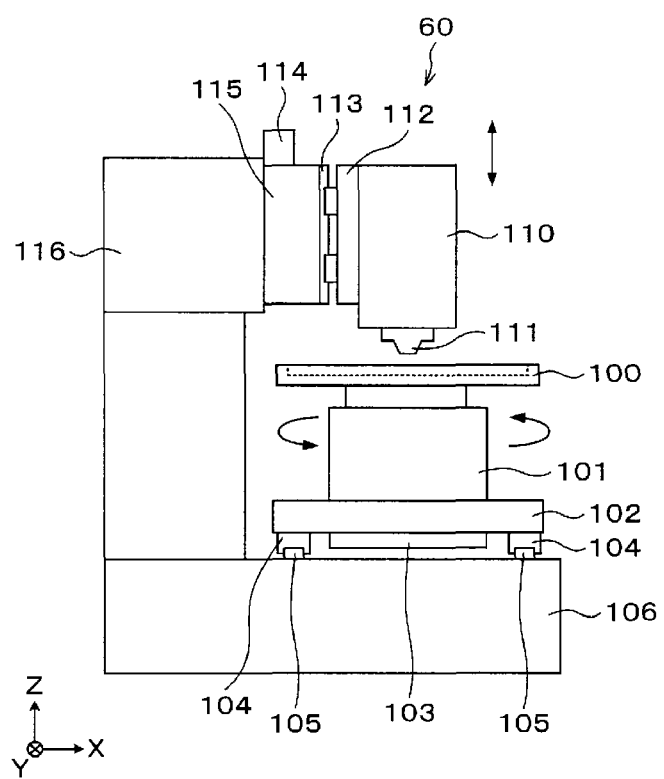
FIG. 5 is a side view schematically illustrating the configuration example of the modifying apparatus.

Now, the aforementioned modifying apparatus 60 will be described. FIG. 4 and FIG. 5 are a plan view and a side view illustrating a schematic configuration of the modifying apparatus 60, respectively.

The modifying apparatus 60 is equipped with a chuck 100 as a holder configured to hold the combined wafer T on a top surface thereof. The chuck 100 is configured to attract and hold the rear surface Sb of the support wafer S in the state that the processing target wafer W is placed at an upper side and the support wafer S is placed at a lower side. The chuck 100 is supported on a slider table 102 with an air bearing 101 therebetween. A rotating mechanism 103 is provided at a bottom surface side of the slider table 102. The rotating mechanism 103 incorporates therein, for example, a motor as a driving source. The chuck 100 is configured to be rotated around a vertical axis by the rotating mechanism 103 via the air bearing 101 therebetween. The slider table 102 is configured to be moved by a moving mechanism 104, which is provided at a bottom surface side of the slider table 102 to serve as a holder moving mechanism, along a rail 105 which is provided on a base 106 and elongated in the Y-axis direction. Further, though not particularly limited, a driving source of the moving mechanism 104 may be, for example, a linear motor.

A laser head 110 serving as a modifying device is provided above the chuck 100. The laser head 110 has a lens 111. The lens 111 is a cylindrical member provided on a bottom surface of the laser head 110, and is configured to radiate the laser light to the processing target wafer W held by the chuck 100.

Further, the laser head 110 is further equipped with a spatial light modulator (not shown). The spatial light modulator modulates laser light and outputs the modulated laser light. Specifically, the spatial light modulator is capable of controlling the focal position and the phase of the laser light, and is thus capable of adjusting the shape and the number (split number) of the laser light radiated to the processing target wafer W. As the spatial light modulator, LCOS (Liquid Crystal on Silicon) may be selected, for example.

In the formation of the internal modification layer M2 to be described later, the laser light radiated from the laser head 110 is switched by this spatial light modulator, and the shape and the number of the laser light are adjusted within a radiation cover range of the laser light L which is determined according to a size of the lens 111. To be specific, by forming condensing points at a plurality of positions within the processing target wafer W at the same time, a plurality of internal modification layers M2 are simultaneously formed (multi-focusing processing). In addition, the number of the condensing points to be simultaneously formed can be set as required according to the output of the laser light and the energy required for the formation of the modification layers.

Further, the term "radiation cover range" of the laser light L means, in a surface of the processing target wafer W to which the laser light L1 is radiated, a range to which the laser light L can be radiated at once via the spatial light modulator. That is, the radiation cover range refers to a range limit to which the laser light L can be radiated by being curved by the lens 111.

In addition, in the present exemplary embodiment, the maximum number of the condensing points that can be simultaneously formed by the spatial light modulator is four, and the radiation cover range of the laser light L is in the range of 150 μm square.

The laser head 110 is configured to concentrate and radiate the laser light having a wavelength featuring transmissivity for the processing target wafer W to a preset position within the processing target wafer W as high-frequency laser light in a pulse shape oscillated from a laser light oscillator (not shown). Accordingly, a portion within the processing target wafer W to which the laser light is concentrated is modified, so that the non-bonding region Ae, the peripheral modification layer M1, the internal modification layer M2 and the central modification layer M3 are formed.

In the present exemplary embodiment, in order to avoid complication of illustration, it is assumed that the non-bonding region Ae, the peripheral modification layer M1, the internal modification layer M2 and the central modification layer M3 are formed by the common laser head 110. However, they may be formed by different laser heads. In addition, the laser heads may be used selectively depending on the type of laser light to be radiated.

The laser head 110 is supported at a supporting member 112. The laser head 110 is configured to be moved up and down by an elevating mechanism 114 along a vertically elongated rail 113. Further, the laser head 110 is configured to be moved in the Y-axis direction by a moving mechanism 115 as a modifying device moving mechanism. Each of the elevating mechanism 114 and the moving mechanism 115 is supported at a supporting column 116.

Above the chuck 100, a macro-camera 120 and a micro-camera 121 are provided at a positive Y-axis side of the laser head 110. For example, the macro-camera 120 and the micro-camera 121 are formed as one body, and the macro-camera 120 is provided at a positive Y-axis side of the micro-camera 121. The macro-camera 120 and the micro-camera 121 are configured to be moved up and down by an elevating mechanism 122, and also configured to be moved in the Y-axis direction by a moving mechanism 123.

The macro-camera 120 is configured to image an outer end portion of the processing target wafer W (combined wafer T). The macro-camera 120 is equipped with, for example, a coaxial lens, and radiates visible light, for example, red light and receives reflection light from a target object. For example, the macro-camera 120 has an image magnification of two times.

The image obtained by the macro-camera 120 is outputted to the control device 90. The control device 90 calculates a first eccentric amount between a center of the chuck 100 and a center of the processing target wafer W from the image obtained by the macro camera 120.

The micro-camera 121 is configured to image a peripheral portion of the processing target wafer W and image a boundary between the bonding region Ac and the non-bonding region Ae. The micro-camera 121 is equipped with, for example, a coaxial lens, and radiates infrared light (IR light) and receives reflection light from a target object. By way of example, the micro-camera 121 has an image magnification of 10 times. A field of view of the micro-camera 121 is about ⅕ of a field of view of the macro-camera 120, and a pixel size of the micro-camera 121 is about ⅕ of a pixel size of the macro-camera 120.

The image obtained by the micro-camera 121 is outputted to the control device 90. In the control device 90, a second eccentric amount between the center of the chuck 100 and the center of the bonding region Ac is calculated from the image obtained by the micro-camera 121. Also, the control device 90 moves the chuck 100 or the laser head 110 based on the second eccentric amount so that the center of the chuck 100 and the center of the bonding region Ac are coincident with each other. In the following description, this control of moving the chuck 100 or the laser head 110 will be sometimes referred to as eccentricity correction.

Figure 6:
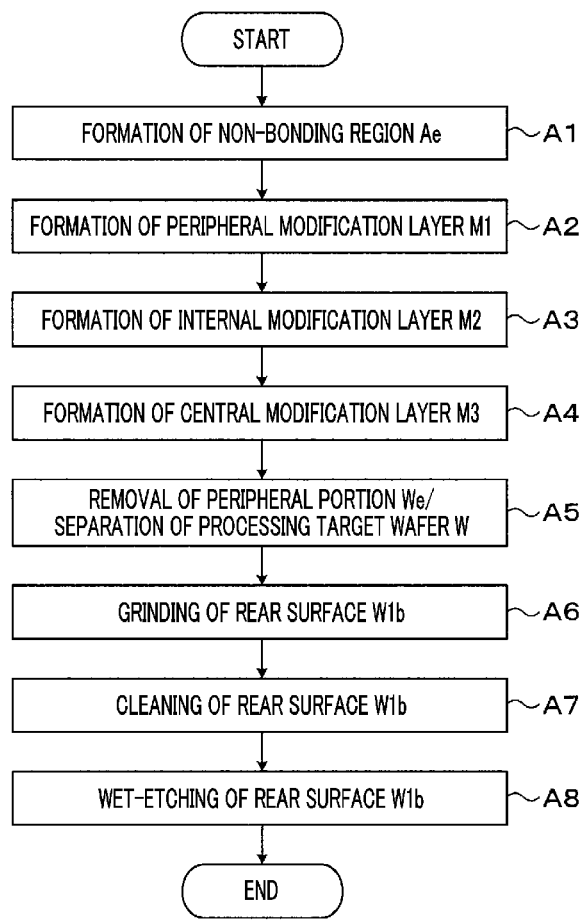
FIG. 6 is a flowchart illustrating an example of main processes of a wafer processing.

Now, a wafer processing performed by using the wafer processing system 1 configured as described above will be discussed. FIG. 6 is a flowchart illustrating main processes of the wafer processing. FIG. 7A to FIG. 7F are explanatory diagrams illustrating the main processes of the wafer processing. In the present exemplary embodiment, the combined wafer T is previously formed by bonding the processing target wafer W and the support wafer S in a bonding apparatus (not shown) at the outside of the wafer processing system 1. Further, although the combined wafer T carried into the wafer processing system 1 is already provided with the aforementioned non-bonding region Ae formed thereat, the following description will be provided for an example where the non-bonding region Ae is formed in the modifying apparatus 60.

Figure 7A:
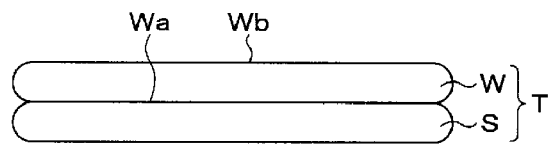
FIG. 7A to FIG. 7F are explanatory diagrams illustrating the example of the main processes of the wafer processing.

First, the cassette Ct accommodating therein the multiple number of combined wafers T shown in FIG. 7A is placed on the cassette placing table 10 of the carry-in/out station 2.

Figure 7B:
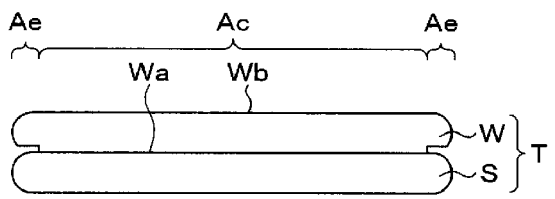
Figure 7C:
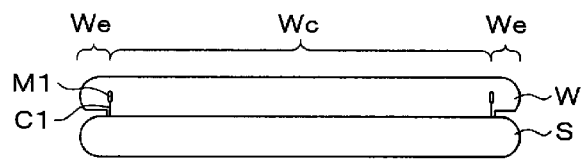
Figure 7D:
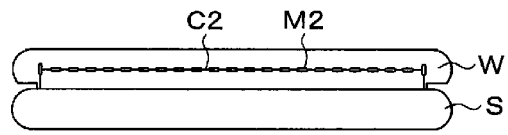

Then, the combined wafer T is taken out of the cassette Ct by the wafer transfer device 20, and transferred into the transition device 30. Subsequently, the combined wafer T is taken out of the transition device 30 by the wafer transfer device 50, and transferred into the modifying apparatus 60. In the modifying apparatus 60, the non-bonding region Ae is first formed, as shown in FIG. 7B (process A1 of FIG. 6). Subsequently, a peripheral modification layer M1 is formed within the processing target wafer W as shown in FIG. 7C (process A2 of FIG. 6), an internal modification layer M2 is formed as shown in FIG. 7D (process A3 of FIG. 6), and a central modification layer M3 is formed (process A4 of FIG. 6). The peripheral modification layer M1 serves as a starting point when the peripheral portion We is removed in the edge trimming. The internal modification layer M2 serves as a starting point for separating the processing target wafer W. The central modification layer M3 controls development of cracks in the central portion of the processing target wafer W and serves as a starting point for the separation in the central portion of the processing target wafer W.

In the modifying apparatus 60, the combined wafer T is carried into the modifying apparatus 60 by the wafer transfer device 50, and held on the chuck 100. Then, the chuck 100 is moved to a formation position of the non-bonding region Ae. The formation position of the non-bonding region Ae is a position where the laser head 110 is capable of radiating the laser light to the peripheral portion We of the processing target wafer W.

Then, by radiating laser light L (for example, $CO_2$ laser) from the laser head 110 while rotating the chuck 100 in a circumferential direction thereof, the non-bonding region Ae is formed (process A1 of FIG. 6). In addition, as described above, the non-bonding region Ae can be formed at any position near the bonding interface as long as the bonding strength between the processing target wafer W and the support wafer S can be reduced.

Here, when the centers of the chuck 100 and the processing target wafer W held on the chuck 100 are not coincident, the non-bonding region Ae is formed to be eccentric with respect to the processing target wafer W. That is, the centers of the processing target wafer W and the non-bonding region Ae (bonding region Ac) do not coincide with each other.

Subsequently, the chuck 100 is moved to a macro-alinement position. The macro-alignment position is a position where the macro-camera 120 is capable of imaging an outer end portion of the processing target wafer W.

Thereafter, the outer end portion of the processing target wafer W is imaged by the macro-camera 120 in 360 degrees in a circumferential direction of the processing target wafer W. The obtained image is outputted to the control device 90 from the macro-camera 120.

In the control device 90, a first eccentric amount between the center of the chuck 100 and the center of the processing target wafer W is calculated from the image obtained by the macro-camera 120. Further, in the control device 90, a moving amount of the chuck 100 is calculated based on the first eccentric amount to correct a Y-axis component of the first eccentric amount. The chuck 100 is moved in the Y-axis direction based on the calculated moving amount, and then moved to a micro-alignment position. The micro-alignment position is a position where the micro-camera 121 is capable of imaging the peripheral portion of the processing target wafer W. Here, the field of view of the micro-camera 121 is smaller (about ⅕) than the field of view of the macro-camera 120, as stated above. Thus, if the Y-axis component of the first eccentric amount is not corrected, the peripheral portion of the processing target wafer W may not be included in an angle of view of the micro-camera 121, resulting in a failure to image the peripheral portion of the processing target wafer W with the micro-camera 121. For the reason, the correction of the Y-axis component based on the first eccentric amount is performed to move the chuck 100 to the micro-alignment position.

Subsequently, a boundary between the bonding region Ac and the non-bonding region Ae is imaged by the micro-camera 121 in 360 degrees in the circumferential direction of the processing target wafer W. The obtained image is outputted to the control device 90 from the micro-camera 121.

In the control device 90, a second eccentric amount between the center of the chuck 100 and a center of the bonding region Ac is calculated from the image obtained by the micro-camera 121. Further, in the control device 90, the position of the chuck 100 with respect to the peripheral modification layer M1 is decided based on the second eccentric amount such that the center of the bonding region Ac and the center of the chuck 100 are coincident with each other.

Then, the chuck 100 is moved to a modification position. The modification position is a position where the laser head 110 radiates laser light to the processing target wafer W to form the peripheral modification layer M1. Further, in the present exemplary embodiment, the modification position is the same as the micro-alignment position.

Figure 8:
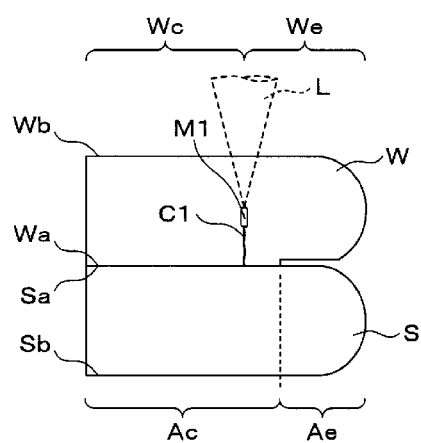
FIG. 8 is an explanatory diagram illustrating a state in which a peripheral modification layer is being formed in a processing target wafer.
Figure 9:
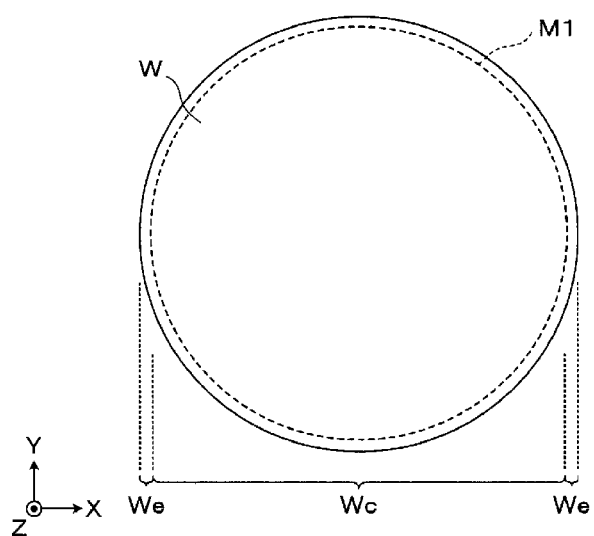
FIG. 9 is an explanatory diagram illustrating a state in which the peripheral modification layer is being formed in the processing target wafer.

Subsequently, as illustrated in FIG. 8 and FIG. 9, by radiating laser light L (for example, YAG laser) from the laser head 110, the peripheral modification layer M1 is formed at the boundary between the peripheral portion We and the central portion We of the processing target wafer W (process A2 of FIG. 6). Further, within the processing target wafer W, a crack C1 develops from the peripheral modification layer M1 in a thickness direction of the processing target wafer W. The crack C1 reaches the front surface Wa but does not reach the rear surface Wb.

A lower end of the peripheral modification layer M1 formed by the laser light L is located above a surface of the separated processing target wafer W after being finally processed. That is, the formation position of the peripheral modification layer M1 is adjusted such that the peripheral modification layer M1 is not left in the first separation wafer W1 after being separated (more specifically, after a grinding processing to be described later).

In the process A2, to locate the chuck 100 at the position decided by the control device 90, the chuck 100 is rotated by the rotating mechanism 103 so that the center of the bonding region Ac and the center of the chuck 100 are coincident, and, also, the chuck 100 is moved in the Y-direction by the moving mechanism 104 (eccentricity correction). At this time, the rotation of chuck 100 and the movement of the chuck 100 in the Y-axis direction are synchronized.

While performing the eccentricity correction of the chuck 100 (processing target wafer W) as described above, the laser light L is radiated to the inside of the processing target wafer W from the laser head 110. That is, while correcting the second eccentric amount, the peripheral modification layer M1 is formed. The peripheral modification layer M1 is formed in a ring shape to be concentric with the bonding region Ac. That is, if the non-bonding region Ae (bonding region Ac) is formed eccentrically with respect to the processing target wafer W, the peripheral modification layer M1 is also formed eccentrically with respect to the processing target wafer W. Since the peripheral modification layer M1 and the non-bonding region Ae are formed concentrically, the peripheral portion We can be appropriately removed starting from the peripheral modification layer M1 (cracks C1).

Further, in the present exemplary embodiment, if the second eccentric amount includes an X-axis component, this X-axis component is corrected by rotating the chuck 100 while moving it in the Y-axis direction. Meanwhile, if the second eccentric amount does not include the X-axis component, the chuck 100 only needs to be moved in the Y-axis direction without being rotated.

Figure 10:
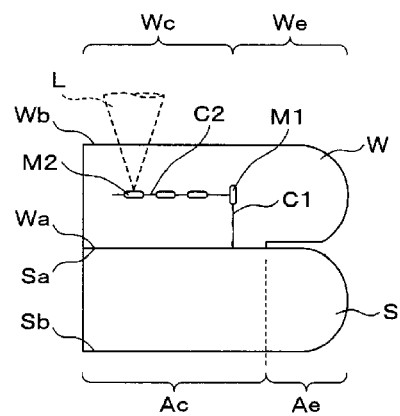
FIG. 10 is an explanatory diagram illustrating a state in which an internal modification layer is being formed in the processing target wafer.

Thereafter, as depicted in FIG. 10, by radiating laser light L (for example, YAG laser) from the laser head 110, the internal modification layer M2 is formed along a plane direction of the processing target wafer W (process A3 of FIG. 6). At this time, the shape and the number of the laser light L radiated from the laser head 110 are adjusted by the spatial light modulator according to the relative horizontal position of the laser head 110 with respect to the processing target wafer W. Details of the method of forming the internal modification layer M2 will be discussed later.

Further, within the processing target wafer W, cracks C2 develop from the internal modification layer M2 along the plane direction. The cracks C2 develop only inside the peripheral modification layer M1 in the diametrical direction. Further, a lower end of the internal modification layer M2 formed by the laser light L is located above the surface of the separated processing target wafer W after being subjected to a final finishing processing. That is, the formation position of the internal modification layer M2 is adjusted so that the internal modification layer M2 is not left at the first separation wafer after the separation (more specifically, after the grinding processing to be described later).

Figure 11:
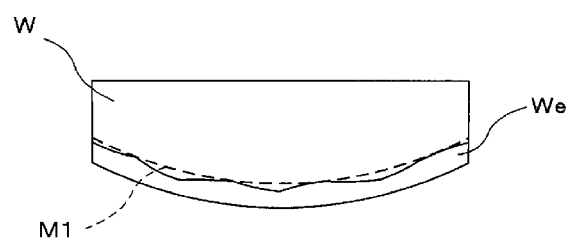
FIG. 11 is an explanatory diagram illustrating removal of a periphery of the processing target wafer.

Here, if the internal modification layer M2 is formed at a diametrically outer side than the peripheral modification layer M1, the quality of the edge trim after the peripheral portion We is removed may be degraded, as illustrated in FIG. 11. That is, the peripheral portion We may not be appropriately removed starting from the peripheral modification layer M1 (crack C1), and a part of the peripheral portion We may remain on the support wafer S. From this point of view, the formation position of the internal modification layer M2 is adjusted so that it is formed at a diametrically inner side than the peripheral modification layer M1.

Figure 12:
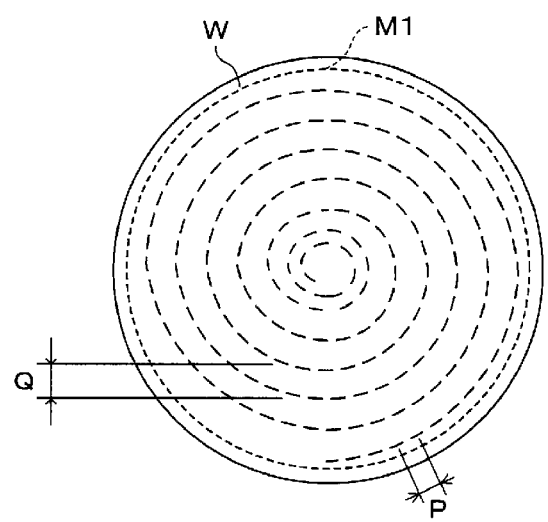
FIG. 12 is an explanatory diagram illustrating the formed internal modification layer.

In addition, when separating the processing target wafer W starting from the internal modification layer M2 as will be described later, it is desirable to control a circumferential pitch P (pulse pitch) and a diametrical interval Q (index pitch) of the internal modification layer M2 shown in FIG. 12 in order to perform the separation uniformly within the surface of the processing target wafer W. Therefore, in the process A3, a rotation speed of the chuck 100 and a frequency of the laser light L are controlled to adjust the intervals of the internal modification layer M2. Specifically, when the position of the laser head 110 in the diametrical direction (radiation position of the laser light L) is located at an outer periphery of the processing target wafer W, the rotation speed is reduced, whereas the position of the laser head 110 in the diametrical direction is located at the central portion of the processing target wafer W, the rotation speed is increased. Further, when the position of the laser head 110 in the diametrical direction (radiation position of the laser light L) is located on the outer periphery of the processing target wafer W, the frequency is increased, and the position of the laser head 110 in the diametrical direction is located on the central portion of the processing target wafer W, the frequency is reduced.

Figure 13A:
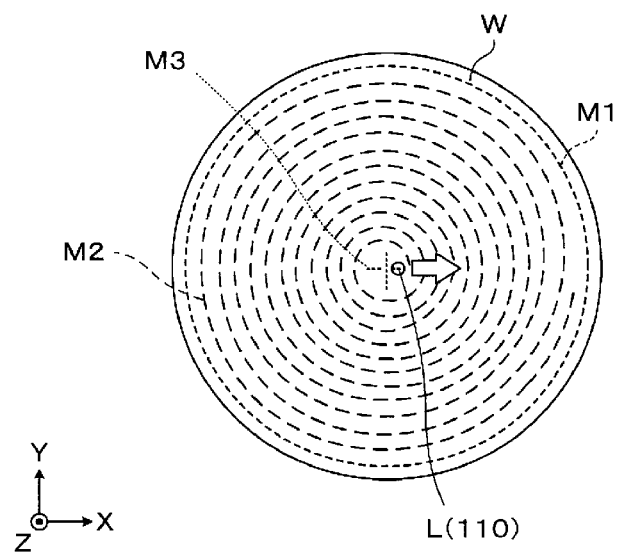
FIG. 13A and FIG. 13B are explanatory diagrams illustrating a state in which a central modification layer is being formed in the processing target wafer.
Figure 13B:
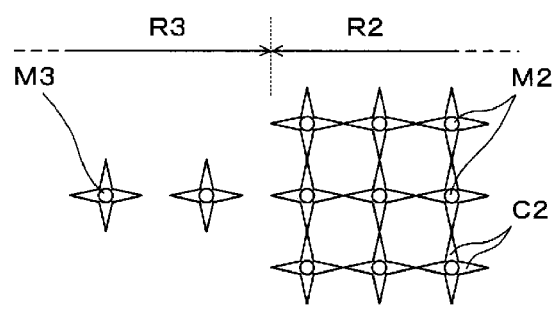

Once the internal modification layer M2 is formed in the processing target wafer W, by radiating the laser light L (for example, YAG laser) from the laser head 110, the central modification layers M3 are formed along the plane direction of the processing target wafer W, as shown in FIG. 13A and FIG. 13B (process A4 of FIG. 6). Within the processing target wafer W, cracks C3 develop from the central modification layers M3 in the plane direction. The central modification layers M3 are formed to be spaced apart from each other (for example, by 10 µm or more) so that the cracks C3 are not connected to each other and are not connected to the cracks C2.

Further, it is desirable that a processing line of the central modification layer M3 is formed so as not to intersect with other modification layers (the internal modification layer M2 and the central modification layer M3) within the surface of the processing target wafer W. Accordingly, the central modification layer M3 can be suppressed from being overlapped with other modification layers, so that the processing target wafer W can be separated appropriately.

In the process A4, by stopping the rotation of the chuck 100 (processing target wafer W) and radiating the laser light L from the laser head 110 to the inside of the processing target wafer W while moving the laser head 110 in horizontal directions (the X-axis direction and the Y-axis direction) above the processing target wafer W, the central modification layer M3 is formed in a straight line shape in the plane direction.

In the formation of this central modification layer M3, the chuck 100 may be moved in the horizontal directions instead of the laser head 110.

After the central modification layer M3 is formed in the processing target wafer W, the combined wafer T is then carried out of the modifying apparatus 60 by the wafer transfer device 70.

Figure 7E:
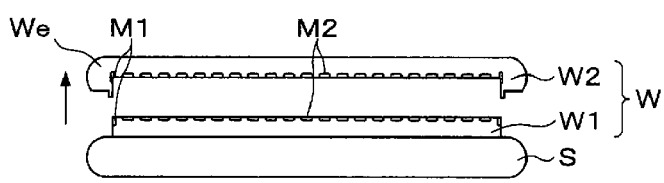

Then, the combined wafer T is transferred into the processing apparatus 80 by the wafer transfer device 70. In the processing apparatus 80, when the combined wafer T is delivered from the transfer ram 71 onto the chuck 83, the processing target wafer W is separated into the first separation wafer W1 and the second separation wafer W2, starting from the peripheral modification layer M1 and the internal modification layer M2 (process A5 of FIG. 6), as illustrated in FIG. 7E. At this time, the peripheral portion We is also removed from the processing target wafer W. Here, since the non-bonding region Ae is formed in the vicinity of the bonding interface between the processing target wafer W and the support wafer S, the peripheral portion We can be easily detached, so that the separation of the processing target wafer W can be carried out appropriately.

Figure 14A:
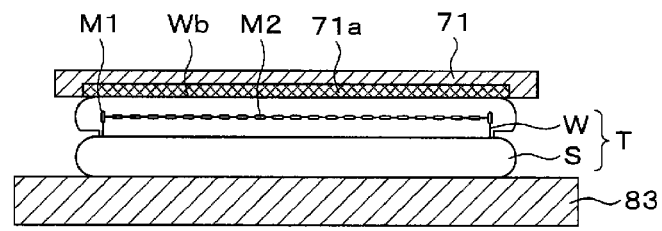
FIG. 14A and FIG. 14B are explanatory diagrams illustrating a state in which the processing target wafer is being separated.
Figure 14B:
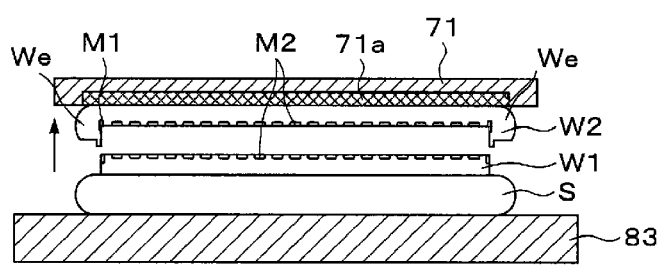

In the process A5, the support wafer S is attracted to and held by the chuck 83 while the processing target wafer W is attracted to and held with an attraction surface 71*a* of the transfer arm 71, as shown in FIG. 14A. Then, as shown in FIG. 14B, the transfer arm 71 is raised in the state that the rear surface Wb of the processing target wafer W is attracted to and held by the attraction surface 71*a*, so that the processing target wafer W is separated into the first separation wafer W1 and the second separation wafer W2. In the process A5 as stated above, the second separation wafer W2 is separated as one body with the peripheral portion We. That is, the removal of the peripheral portion We and the separation (thinning) of the processing target wafer W are performed at the same time.

The separated second separation wafer W2 is collected to, for example, the outside of the wafer processing system 1. By way of example, a collector (not shown) may be provided within a movable range of the transfer arm 71, and the separated second separation wafer W2 may be collected by releasing the attraction of the second separation wafer W2 in the collector.

In the present exemplary embodiment, the processing target wafer W is separated by using the wafer transfer device 70 in the processing apparatus 80. However, a separation apparatus (not shown) for separating the processing target wafer W may be provided in the wafer processing system 1. This separation apparatus may be stacked on, for example, the modifying apparatus 60.

Figure 7F:
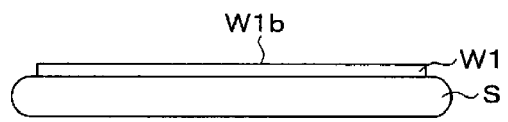

Next, the chuck 83 is moved to the processing position 80*b*. Then, as shown in FIG. 7F, a rear surface W1*b* as a separated surface of the first separation wafer W1 held by the chuck 83 is ground by the grinding unit 84, and the peripheral modification layer M1, the internal modification layer M2 and the central modification layer M3 remaining on the rear surface W1*b* are removed (process A6 of FIG. 6). In the process A6, by respectively rotating the first separation wafer W1 and the grinding whetstone while keeping the grinding whetstone in contact with the rear surface W1*b*, the rear surface W1*b* is ground. Further, the rear surface W1*b* of the first separation wafer W1 may be then cleaned with a cleaning liquid by using a cleaning nozzle (not shown).

Subsequently, the combined wafer T is transferred to the cleaning apparatus 41 by the wafer transfer device 70. In the cleaning apparatus 41, the rear surface W1*b* of the first separation wafer W1 as the ground surface is scrub-cleaned (process A7 of FIG. 6). Further, in the cleaning apparatus 41, the rear surface Sb of the support wafer S as well as the rear surface W1*b* of the first separation wafer W1 may be cleaned.

Afterwards, the combined wafer T is transferred to the etching apparatus 40 by the wafer transfer device 50. In the etching apparatus 40, the rear surface W1*b* of the first separation wafer W1 as the separated surface is wet-etched by a chemical liquid (process A8 of FIG. 6). A grinding mark may be formed on the rear surface W1*b* ground by the aforementioned processing apparatus 80. In the process A8, the grinding mark can be removed by performing the wet-etching, so that the rear surface W1*b* can be flattened.

Then, the combined wafer T after being subjected to all the required processings is transferred to the transition device 30 by the wafer transfer device 50, and then transferred into the cassette Ct on the cassette placing table 10 by the wafer transfer device 20. Accordingly, a series of the processes of the wafer processing in the wafer processing system 1 is ended.

In the above-described exemplary embodiment, the processing sequence of the processes A1 to A8 may be appropriately changed.

As a first modification example, the order of the formation of the peripheral modification layer M1 in the process A2 and the formation of the internal modification layer M2 in the process A3 may be reversed. In this case, the wafer processing is performed in the order of the process A1, the process A3, the process A2, and the processes A4 to A8.

As a second modification example, the formation of the central modification layer M3 in the process A4 may be performed before the formation of the peripheral modification layer M1 in the process A2. In this case, the wafer processing is performed in the order of the process A1, the process A4, the processes A2 and A3, and the processes A5 to A8.

As a third modification example, the formation of the central modification layer M3 in the process A4 may be performed before the formation of the internal modification layer M2 in the process A3. In this case, the wafer processing is performed in the order of the processes A1 and A2, the process A4, the process A3, and the processes A5 to A8.

As a fourth modification example, the formation of the non-bonding region Ae in the process A1 may be performed after the formation of the peripheral modification layer M1 in the process A2. In this case, the wafer processing is performed in the order of the process A2, the process A1, and the processes A3 to A8.

As a fifth modification example, the formation of the non-bonding region Ae in the process A1 may be performed after the formation of the internal modification layer M2 in the process A3. In this case, the wafer processing is performed in the order of the processes A2 and A3, the process A1, and the processes A4 to A8.

Further, in the above-described exemplary embodiment, the processings of the processes A1 to A8 may be appropriately omitted.

As a first example of the omission, the removal of the peripheral modification layer M1, the internal modification layer M2 and the central modification layer M3 in the process A6 may be carried out by the wet etching in the process A8. In this case, the grinding processing of the process A6 may be omitted.

As a second example of the omission, if the peripheral modification layer M1, the internal modification layer M2, and the central modification layer M3 are properly removed and no grinding mark is formed in the grinding processing of the process A6, the wet etching of the process A8 may be omitted.

As a third example of the omission, if the combined wafer T having the non-bonding region Ae formed therein is carried into the wafer processing system 1, the formation of the non-bonding region Ae in the process A1 may be omitted.

Further, if the formation of the non-bonding region Ae is performed after the alignment of the processing target wafer W in the modifying apparatus 60 as in the above-described modification examples 4 and 5, the above-described micro-alignment (calculation of the second eccentric amount between the center of the chuck 100 and the bonding region Ac by imaging the boundary of the non-bonding region Ae) may be omitted. In this case, the formation of the peripheral modification layer M1 in the process A2 may be carried out based on the result of the macro-alignment.

Figure 15A:
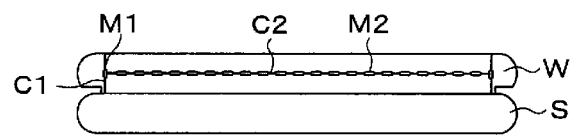
FIG. 15A and FIG. 15B are explanatory diagrams illustrating another method of separating the processing target wafer.
Figure 15B:
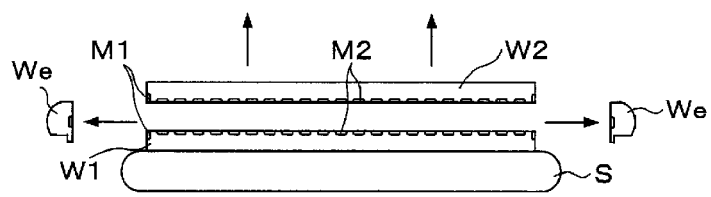

Furthermore, in the process A5 of the above-described exemplary embodiment, the second separation wafer W2 is separated as one body with the peripheral portion We, that is, the removal of the peripheral portion We and the thinning of the processing target wafer W are performed at the same time. However, the second separation wafer W2 and the peripheral portion We do not have to be separated at the same time. For example, the second separation wafer W2 may be separated after the peripheral portion We is removed by the edge trimming. In this case, by allowing the crack C1 developing from the peripheral modification layer M1 formed in the process A2 to reach the front surface Wa and the rear surface Wb as shown in FIG. 15A, the edge trimming processing and the thinning processing can be performed appropriately, as illustrated in FIG. 15B. There may be a case where the peripheral portion We need not be removed. In this case, the alignment of the processing target wafer W may be performed by the outer end of the processing target wafer W instead of the boundary between the bonding region Ac and the non-bonding region Ae.

Figure 16:
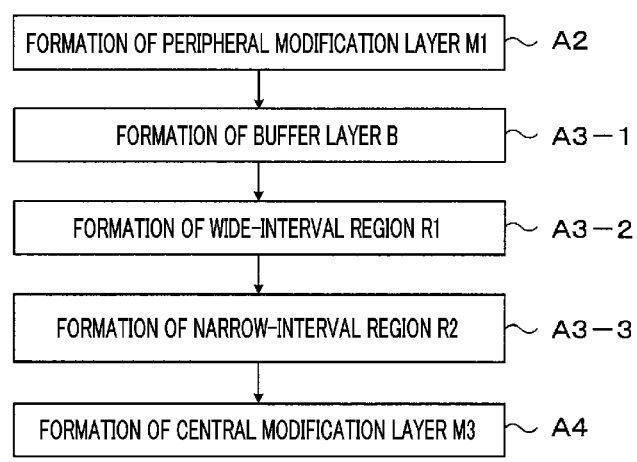
FIG. 16 is a flowchart illustrating an example of an internal modification layer forming process according to an exemplary embodiment.

Now, the method of forming the internal modification layer M2 in the process A3 will be described. FIG. 16 is a flowchart showing main processes of forming the internal modification layer M2, and FIG. 17A to FIG. 17E are explanatory diagrams for describing radiation conditions for the laser light controlled by the spatial light modulator in the formation of the internal modification layer M2. Further, the peripheral modification layer M1 and the cracks C1 are formed in the processing target wafer W prior to the formation of the internal modification layer M2 (the process A2 of FIG. 6 and FIG. 16)

As stated above, it is desirable that the internal modification layer M2 is formed at the diametrically inner side than the peripheral modification layer M1 in order to suppress deterioration of the quality of the edge trimming. Here, in case that the peripheral modification layer M1 is formed eccentrically with respect to the processing target wafer W as described above and the above-described first and second eccentric amounts are not properly corrected, the internal modification layer M2 may not be properly formed if the formation of the internal modification layer M2 is performed without taking this eccentricity into account. To be specific, there is a concern that the internal modification layer M2 may be formed at the diametrically outside of the peripheral modification layer M1, resulting in deterioration of precision of the edge trimming, or the internal modification layer M2 may not be formed in the entire surface of the processing target wafer W, resulting in a failure to properly separate the processing target wafer W.

Further, it is desirable that the internal modification layer M2 is formed in a spiral shape in the surface of the processing target wafer W, as will be described later. However, when forming this spiral shape while performing the aforementioned eccentricity correction, that is, when forming the spiral shape to follow the eccentricity, the chuck 100 and the laser head 110 need to be reciprocated in a horizontal direction at a high speed at the central portion of the processing target wafer W. If, however, the chuck 100 and the laser head 110 are reciprocated at such a high speed, there arise concerns that the operation of the eccentricity correction cannot follow the operation of forming the internal modification layer M2, and occurrence of resonance and reduction of guide lifetime may be caused.

In view of the foregoing, in the formation of the internal modification layer M2 according to the present exemplary embodiment, a buffer layer B as a first internal modification layer for absorbing the eccentricity of the bonding region Ac is formed along the peripheral modification layer M1 at the diametrically inner side than the peripheral modification layer M1 while performing the eccentricity correction of the chuck 100 (processing target wafer W) (process A3-1 in FIG. 16). For example, the buffer layer B is formed in a processing width (for example, 200 μm) equal to or larger than the eccentric amount of the non-bonding region Ae and the peripheral modification layer M1.

In the formation of the buffer layer B, the laser light L radiated from the laser head 110 is switched by the spatial light modulator, and the arrangement (interval) and the number of the laser light L are adjusted. Specifically, as shown in FIG. 17A, a plurality of, for example, four condensing points are formed within the processing target wafer W in the diametrical direction thereof, so that four internal modification layers M2 are formed at the same time. A diametrical interval Q1 as a first diametrical interval between the internal modification layers M2 is, for example, 10 μm. In addition, in the following description, this radiation pattern of the laser light L in which the diametrical interval is 10 μm and the four condensing points are arranged in the diametrical direction may sometimes be referred to as "first condensing pattern."

After the rotation speed of the chuck 100 is rate-controlled (becomes constant) after its rotation is begun, the laser light L is periodically radiated to the inside of the processing target wafer W from the laser head 110 while rotating the chuck 100 (processing target wafer W) one round (360 degrees) at least, so that the annular internal modification layer M2 is formed. Then, the laser head 110 is relatively moved inward in the diametrical direction of the processing target wafer W (Y-axis direction). By forming the internal modification layers M2 within the processing width along the plane direction by repeating the formation of the annular internal modification layer M2 and the diametrically inward movement of the laser head 110, the internal modification layers M2 as the buffer layer B concentric with the non-bonding region Ae and the peripheral modification layer M1 are formed.

Further, the frequency of the laser light L in forming the buffer layer B is, for example, 80 kHz. Here, the conditions for the formation of these internal modification layers M2 are just examples and can be changed as required.

After the buffer layer B is formed, the internal modification layer M2 as a second internal modification layer is formed in a spiral shape from a certain point within the processing width of the buffer layer B, for example. In the formation of this spiral-shaped internal modification layer M2, the above-described eccentricity correction is not performed. That is, in the present exemplary embodiment, the peripheral modification layer M1 and the internal modification layers M2 forming the buffer layer B are formed while performing the eccentricity correction, whereas the spiral-shaped internal modification layers M2 formed at the diametrically inner side than the buffer layer B are formed without performing the eccentricity correction.

Figure 18A:
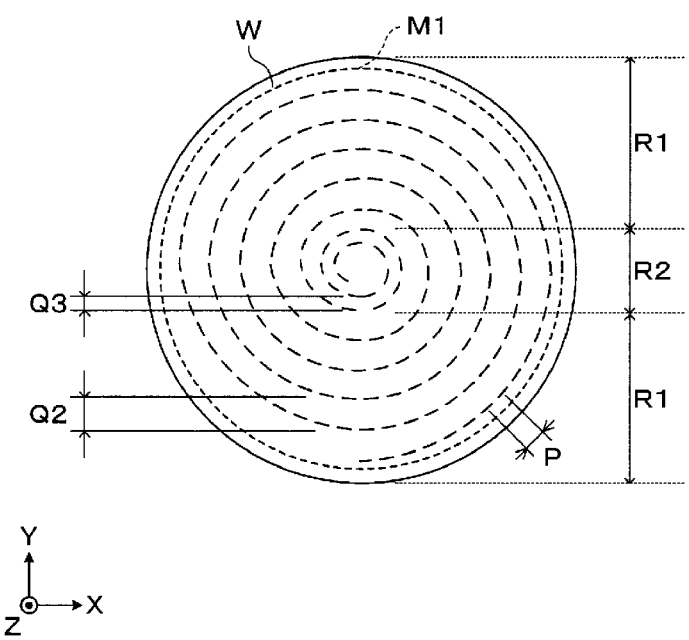
FIG. 18A and FIG. 18B are explanatory diagrams illustrating an internal modification layer to be formed within the processing target wafer.

Further, in the formation of the spiral-shaped internal modification layer M2, there are formed areas in which the diametrical interval Q of the internal modification layer M2 is set to be different, as shown in FIG. 18, to perform the separation of the processing target wafer W appropriately. To elaborate, a wide-interval region R1 as a first modification layer formation region in which the diametrical interval Q between the neighboring internal modification layers M2 is set to be wide is formed at a diametrically outer side of the processing target wafer W (process A3-2 of FIG. 16), and a narrow-interval region R2 as a second modification layer formation region in which the diametrical interval Q between the neighboring internal modification layers M2 is set to be narrow is formed at a diametrically inner side than the wide-interval region R1 (process A3-3 of FIG. 16). Further, the circumferential interval P between the internal modification layers M2 is constant over the entire circumference both in the wide-interval region R1 and the narrow-interval region R2.

Figure 18B:
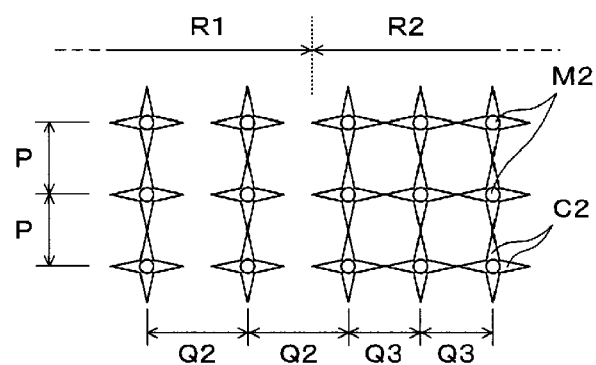

Here, in the wide-interval region R1, a diametrical interval Q2 as a second diametrical interval between the neighboring internal modification layers M2 is set such that the cracks C2 which develop in the plane direction during the formation of these neighboring internal modification layers M2 are not connected to each other, as shown in FIG. 18B. Further, in the narrow-interval region R2, a diametrical interval Q3 as a third diametrical interval between the neighboring internal modification layers M2 is set so that the cracks C2 which develop in the plane direction during the formation of these neighboring internal modification layers M2 are connected to each other, as shown in FIG. 18B. As an example, the diametrical interval Q2 between the internal modification layers M2 in the wide-interval region R1 may be 60 μm, and the diametrical interval Q3 between the internal modification layers M2 in the narrow-interval region R2 may be 10 μm.

In the formation of the wide-interval region R1 as well, the laser light L radiated from the laser head 110 is switched by the spatial light modulator, and the arrangement (interval) and the number of the laser light L are adjusted. Here, the same as in the formation of the buffer layer B, it is desirable to form four internal modification layers M2 in the diametrical direction in the formation of the wide-interval region R1. As mentioned above, however, the range in which the laser light L can be radiated by the spatial light modulator is in the range of 150 μm square. That is, in the wide-interval region 181, it is not possible to form the four internal modification layers M2 simultaneously in the diametrical direction at the diametrical interval Q2 (60 μm).

Thus, in the present exemplary embodiment, four internal modification layers M2 in total including two along the diametrical direction and two along the circumferential direction are formed simultaneously within the processing target wafer W, as shown in FIG. 17B. The diametrical interval Q2 between the internal modification layers M2 is, for example, 60 μm, and the circumferential interval P therebetween is, for example, 10 μm. Further, in the following description, this radiation pattern of the laser light L in which the diametrical interval is 60 μm, the circumferential interval is 10 μm, and the four condensing points are arranged in an approximately rectangular shape may sometimes be referred to as "second condensing pattern."

By radiating the laser light L periodically from the laser head 110 to the inside of the processing target wafer W while rotating the chuck 100 relative to the laser head 110 by the rotating mechanism 103, and, also, by moving the chuck 100 in the Y-axis direction by the moving mechanism 104, the internal modification layers M2 are formed in the plane direction. Accordingly, the spiral-shaped internal modification layers M2 are formed at the diametrically inside of the peripheral modification layer M1.

In forming the wide-interval region 181, the rotation speed of the processing target wafer W is, for example, 600 rpm, and the frequency of the laser light L is, for example, 80 kHz.

Here, in order to uniformly separate the processing target wafer W in the plane, it is desirable that the formation interval of the internal modification layers M2 is uniform as stated above. However, in the formation of the internal modification layers M2, if the rotation speed of the chuck 100 and the frequency of the laser light L are controlled constant, the circumferential interval P between the internal modification layers M2 reaches a critical point where it can be no more controlled constant. In this state, if the radiation position of the laser light L is moved further inwards in the diametrical direction, the circumferential interval P gets smaller, causing the internal modification layers M2 to be overlapped on the same processing line. If the internal modification layers M2 are formed to overlap each other in this way, the processing target wafer W may not be separated appropriately, or transmitted light of the laser light may be generated, resulting in a damage on the device layer D.

Further, when forming the internal modification layers M2 by the aforementioned second condensing pattern, the frequency of the laser light L becomes substantially twice with respect to the rotation speed of the processing target wafer W, and the position where the circumferential interval P reaches the critical point is located at a diametrically outer side, as compared to the case where the condensing points of the laser light L are arranged in the diametrically direction.

Accordingly, if the circumferential interval P reaches the critical point in the second condensing pattern in the formation of the wide-interval region R1, the laser light L radiated from the laser head 110 is switched by the spatial light modulator, and the arrangement (interval) and the number of the laser light L are adjusted. To elaborate, as shown in FIG. 17C, by forming a plurality of, for example, three condensing points within the processing target wafer W along the diametrical direction thereof, three internal modification layers M2 are simultaneously formed. The diametrical interval Q2 between the internal modification layers M2 is, for example, 60 μm. Further, in the following description, this radiation pattern of the laser light L in which the diametrical interval is 60 μm and the three condensing points are arranged in the diametrical direction may sometimes be referred to as "third condensing pattern."

Further, the formation ranges of the wide-interval region R1 and the narrow-interval region R2 can be selected as required. When the critical point in the above-described second condensing pattern does not exist in the formation range of the wide-interval region R1, the formation of the internal modification layers M2 by the third condensing pattern may be omitted.

Once the wide-interval region R1 is formed, the laser light L radiated from the laser head 110 is switched by the spatial light modulator, and the arrangement (interval) and the number of the laser light L are adjusted, and the formation of the narrow-interval region R2 is begun. Specifically, as shown in FIG. 17D, the four internal modification layers M2 are simultaneously formed by forming the plurality of, for example, the four condensing points within the processing target wafer W along the diametrical direction. The diametrical interval Q3 between the internal modification layers M2 is, for example, 10 μm. That is, the narrow-interval region R2 is formed by the "first condensing pattern," the same as in the formation of the buffer layer B.

In addition, the frequency of the laser light L in forming the narrow-interval region R2 is, for example, 70 kHz. The narrow-interval region R2 is formed at the diametrically inner side than the wide-interval region R1 as described above. By reducing the frequency of the laser light L in this way, the circumferential interval P between the internal modification layers M2 to be formed can be controlled to be constant within the surface of the processing target wafer W. Moreover, the circumferential interval P between the internal modification layers M2 can be controlled by increasing the rotational speed of the chuck 100 instead of or in addition to reducing the frequency of the laser light L.

However, when the rotation speed of the chuck 100 reaches an upper limit and the frequency of the laser light L reaches a lower limit, the circumferential interval P between the internal modification layers M2 reaches a final critical point where it cannot be enlarged any more. In this state, if the radiation position of the laser light L is moved further inwards in the diametrical direction, the circumferential interval P becomes smaller, and the internal modification layers M2 may be overlapped on the same processing line in the central portion of the processing target wafer W, as described above.

Thus, the formation of the narrow-interval region R2, that is, the formation of the internal modification layers M2 is terminated near the central portion of the processing target wafer W where the circumferential interval P of the internal modification layers M2 reaches the final critical point, and the central modification layer M3 is formed at the diametrically inner side than the internal modification layers M2, as shown in FIG. 17E (process A4 in FIG. 6 and FIG. 16). A formation range R3 of the central modification layers M3 can be calculated from, for example, the minimum value of the frequency of the laser light L and the maximum value of the rotation speed of the chuck 100 (for example, a range of 1 mm to 2 mm from the center of the processing target wafer W).

Further, if the processing lines of the central modification layers M3 are not formed to cross each other or be closed to each other as stated above, the central modification layers M3 may be formed to have any of various shapes (for example, a linear shape, a curved shape, or a combination of the linear shape and the curved shape).

The internal modification layers M2 are formed in the process A3 as described above.

According to the above-described exemplary embodiment, by forming the plurality of internal modification layers M2 at the same time in the formation of the internal modification layers M2 within the processing target wafer W, throughput of the modifying apparatus 60 can be improved, and, thus, productivity (tact) can be improved.

At this time, by selecting and controlling the condensing pattern of the laser light L with respect to the processing target wafer W depending on the position of the laser head 110 with respect to the processing target wafer W in the diametrical direction, the tact can be improved more appropriately.

In addition, the condensing pattern of the laser light is selected as required according to various conditions such as the relative rotation speed of the chuck 100 (processing target wafer W) at the condensing position of the laser light, the frequency of the laser light, and the radiation cover range, which is determined according to a size of the lens 111, as a tolerance range of the laser light in the diametrical direction and a tolerance range thereof in the circumferential direction, and the maximum radiation number of the laser light available. In other words, the condensing pattern of the laser light can be selected based on the relative rotation speed of the chuck 100 (processing target wafer W) at the condensing position of laser light and a radiation pitch of the laser light L, that is, the circumferential interval P at which the internal modification layers M2 are formed.

By way of example, in order to improve the throughput for the formation of the internal modification layers M2, a plurality of condensing points are arranged in the circumferential direction at the outer periphery of the processing target wafer W where the rotation speed of the chuck 100 is slow. The number of the condensing points arranged in the circumferential direction is determined according to the rotation speed of the chuck 100. Then, when there is a possibility that the internal modification layers M2 are overlapped in the circumferential direction due to an increase in the rotational speed, the number of the condensing points arranged in the circumferential direction is reduced and the number of the condensing points arranged in the diametrical direction is increased. As described above, by maximizing the number of the internal modification layers M2 to be formed at one time based on the relative rotation speed of the chuck 100 and the radiation pitch of the laser light, the throughput can be improved.

Furthermore, in the formation of the internal modification layers M2, the larger the number of the condensing points of the laser light formed at the same time is, that is, the larger the number of the internal modification layers M2 formed at the same time is, the more efficiently the formation of the internal modification layers M2 can be carried out, so that the throughput can be improved.

In addition, the condensing pattern of the laser light is not limited to the examples of the above-described exemplary embodiment. For example, the laser light may be arranged in multiple number only in the circumferential direction. When a plurality of laser lights are arranged in the diametrical direction, the rotation number of the processing target wafer W can be controlled to be constant regardless of the position of the laser head 110 in the diametrical direction. Meanwhile, when a plurality of laser lights are arranged in the circumferential direction, the formation of the internal modification layers M2 can be performed by increasing the rotation speed of the processing target wafer W.

Further, since the maximum laser light radiation number available is determined based on an output of the laser light, the internal modification layers M2 can be more formed in any pattern according to the maximum radiation number available.

Furthermore, in the above-described exemplary embodiment, the frequency of the laser light is controlled to be 80 kHz in the formation of the buffer layer B and the wide-interval region R1 and 70 kHz in the narrow-interval region R2. However, the frequency of the laser light is not limited thereto, either. For example, the frequency of the laser light may be controlled to be changed continuously according to the position of the laser head 110 in the diametrical direction or the relative rotation speed of the processing target wafer W at the condensing point of the laser light. Further, although the frequency of the laser light L is changed in this way in the above-described exemplary embodiment, the rotation speed of the chuck 100 (processing target wafer W) may be changed.

In the present exemplary embodiment, in the formation of the spiral-shaped internal modification layers M2 (the wide-interval region R1 and the narrow-interval region R2), the laser light L radiated from the laser head 110 is switched by the spatial light modulator and the arrangement (interval) and the number of the laser light are adjusted, as described above. Specifically, in forming the spiral-shaped internal modification layers M2, the internal modification layers M2 are formed in the entire surface of the processing target wafer W while switching the plurality of condensing patterns.

Here, when the condensing pattern of the laser light is switched, there exists a delay time until the laser light from the laser head 110 is actually switched after the control device 90 outputs a system signal. In the formation of the internal modification layers M2, since the condensing pattern is switched while rotating the processing target wafer W as described above, the rotation of the processing target wafer W in the above-described delay time needs to be taken into account in controlling alignment between the critical point and a switching position where the condensing pattern is switched. That is, the system signal needs to be outputted before the laser head 110 reaches a position above the required switching position of the laser light.

Here, when the internal modification layers M2 are formed in the spiral shape, the rotation speed of the chuck 100 and the frequency of the laser light are controlled according to the position of the laser head 110 with respect to the processing target wafer W in order to maintain constant the circumferential interval P (pulse pitch) of the internal modification layers M2 to be formed. In other words, since the rotation speed differs depending on various conditions such as the switching position of the laser light, a moving amount accompanying the rotation of the processing target wafer W in the delay time may be different.

Thus, when controlling the condensing pattern of the laser light for the formation of the internal modification layers M2 as described above, it is desirable to control a timing for the switching of the laser light based on the rotation speed of the processing target wafer W at the condensing position of the laser light and the delay time.

Further, according to the above-described exemplary embodiment, the internal modification layers M2 are formed along the plane direction of the processing target wafer W so that the wide-interval region R1 and the narrow-interval region R2 are formed. However, the diametrical interval Q between the internal modification layers M2 may be uniform in the entire surface of the processing target wafer W. Specifically, the spiral-shaped internal modification layers M2 may be formed at the diametrical interval Q1 of the internal modification layers M2 in the buffer layer B, for example. If the diametrical interval Q is uniform in the entire surface of the processing target wafer W, the separation of the processing target wafer W can be performed uniformly in the entire surface thereof.

Additionally, according to the above-described exemplary embodiment, although the internal modification layers M2 are formed in the spiral shape within the surface of the processing target wafer W, the shape in which the internal modification layers M2 are formed may not be limited thereto, and they may be formed in a ring shape to be concentric with the non-bonding region Ae and the peripheral modification layer M1.

In such a case, by repeating the formation of the annular internal modification layer M2 and the diametrically inward movement of the laser head 110, the internal modification layers M2 are formed in the plane direction.

Figure 19A:
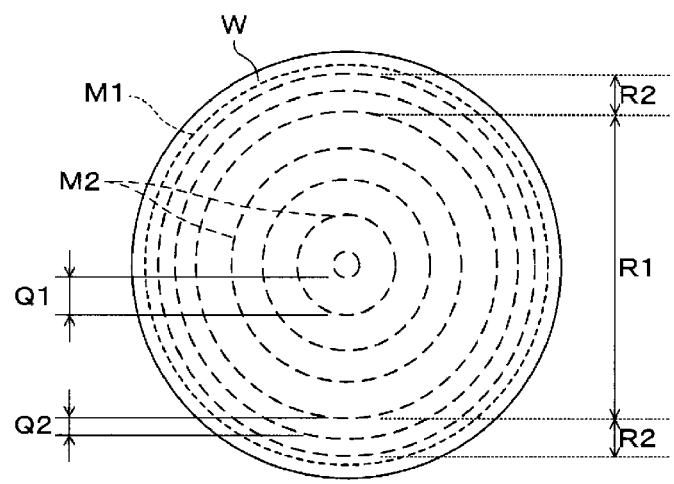
FIG. 19A and FIG. 19B are explanatory diagrams illustrating another example of the formation of the internal modification layer.
Figure 19B:
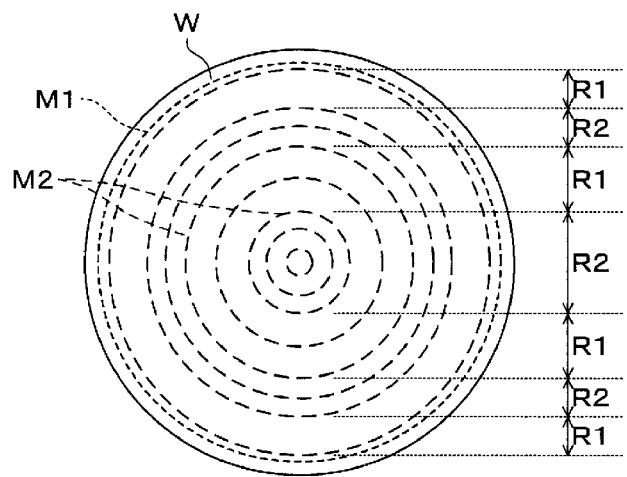

Moreover, according to the above-described exemplary embodiment, the wide-interval region R1 is formed at the diametrically outer side, and the narrow-interval region R2 is formed at the diametrically inner side. As shown in FIG. 19A, however, the narrow-interval region R2 may be formed at the diametrically outer side of the processing target wafer W, and the wide-interval region R1 may be formed inside this narrow-interval region R2, when viewed from the top. As another example, as shown in FIG. 19B, the wide-interval region R1 and the narrow-interval region R2 may be alternately formed at the diametrically outer side of the processing target wafer W.

Further, in the above-described exemplary embodiment, the wide-interval region R1 and the narrow-interval region R2 are formed with respect to the diametrical direction of the processing target wafer W, that is, the diametrical interval Q of the internal modification layers M2 is changed. Instead, however, the circumferential interval P (pulse pitch) may be changed. Moreover, both the diametrical interval Q and the circumferential interval P may be changed. In such a case, since the number of the internal modification layers M2 to be formed within the surface of the processing target wafer W is further reduced, the throughput can be further improved.

It should be noted that the above-described exemplary embodiment is illustrative in all aspects and is not anyway limiting. The above-described exemplary embodiment may be omitted, replaced and modified in various ways without departing from the scope and the spirit of claims.

For example, although the above exemplary embodiment has been described for the example where the processing target wafer W as a processing target object is a silicon wafer, the kind of the processing target object is not limited thereto. By way of non-limiting example, a glass substrate, a single crystalline substrate, a polycrystalline substrate, an amorphous substrate, or the like may be selected as the processing target object instead of the silicon substrate. In addition, an ingot, a base, or a thin plate may be selected as the processing target object instead of the circular substrate.

For example, in the above-described exemplary embodiment, the processing target wafer W is separated using the peripheral modification layer M1 and the internal modification layers M2 as starting points. However, the starting points for separating the processing target wafer W is not limited thereto. By way of example, a modification layer may be formed by radiating laser light to the entire inner surface of the oxide film Fw or the oxide film Fs, and the processing target wafer W may be separated using this modification layer as a starting point. As another example, before the processing target wafer W is processed in the wafer processing system 1, an oxide film (not shown) may be formed between the processing target wafer W and the device layer D, and a modification layer may be formed by radiating laser light to the entire inner surface of this oxide film. Then, the processing target wafer W may be separated using this modification layer as a starting point. As still another example, an adhesive layer (not shown) may be formed at the interface between the processing target wafer W and the support wafer S, and a modification layer may be formed by radiating laser light to the entire inner surface of this adhesive layer. Then, the processing target wafer W may be separated starting from this modification layer. In addition, it is assumed that the modification layer for separating the processing target wafer W may include sublimation by laser ablation or the like.

According to the exemplary embodiment, it is possible to improve efficiency of a separating processing for a processing target object.

We claim:
1. A processing apparatus configured to process a processing target object, comprising:
   a holder configured to hold the processing target object;
   a modifying device configured to form multiple condensing points along a plane direction of the processing target object by radiating laser light to an inside of the processing target object;
   a moving mechanism configured to move the holder and the modifying device in a horizontal direction relative to each other;
   a rotating mechanism configured to rotate the holder and the modifying device relative to each other; and
   a controller configured to control an operation of forming the condensing points in the processing target object,
   wherein in forming the condensing points by radiating the laser light to the inside of the processing target object periodically from the modifying device while rotating the processing target object held by the holder relative to the modifying device by the rotating mechanism and, also, by moving the modifying device in a diametrical direction relative to the holder by the moving mechanism, the controller controls a number and an arrangement of the condensing points, which are simultaneously formed at different positions in the plane direction of the processing target object, based on a relative rotation number of the processing target object and a radiation pitch of the laser light.

2. The processing apparatus of claim 1,
   wherein the condensing points formed within the processing target object form modification layers,
   the modification layers include a peripheral modification layer serving as a starting point where a peripheral portion of the processing target object as a removing target is detached; a first internal modification layer formed in a ring shape to be concentric with the peripheral modification layer at a diametrically inner side than the peripheral modification layer; and a second internal modification layer formed at a diametrically inner side than the first internal modification layer, and
   in forming the first internal modification layer, the first internal modification layer having multiple first internal modification layers, the controller controls an operation of forming the modification layers such that the multiple first internal modification layers are simultaneously formed in the diametrical direction of the processing target object.

3. The processing apparatus of claim 2,
   wherein the controller controls the operation of forming the modification layers such that the multiple first internal modification layers are simultaneously formed at a first diametrical interval along the diametrical direction of the processing target object, and such that, in forming the second internal modification layer, the second internal modification layer having multiple second internal modification layers, the multiple second internal modification layers are simultaneously formed at a second diametrical interval larger than the first diametrical interval along the diametrical direction of the processing target object.

4. The processing apparatus of claim 2,
   wherein the controller controls the operation of forming the modification layers such that the multiple first internal modification layers are simultaneously formed at a first diametrical interval along the diametrical direction of the processing target object, and such that, in forming the second internal modification layer, the second internal modification layer having multiple second internal modification layers, the multiple second internal modification layers are simultaneously formed at the first diametrical interval along the diametrical direction of the processing target object.

5. The processing apparatus of claim 2,
   wherein the second internal modification layer has multiple second internal modification layers, and
   the controller controls the operation of forming the modification layers such that the multiple second internal modification layers are simultaneously formed along a circumferential direction, and such that a circumferential interval between the second internal modification layers to be simultaneously formed is equal to a circumferential interval between the first internal modification layers formed in the processing target object.

6. The processing apparatus of claim 2,
   wherein the second internal modification layer has multiple second internal modification layers, and
   the controller controls the operation of forming the modification layers such that the multiple first internal modification layers are simultaneously formed at a first diametrical interval along the diametrical direction of the processing target object, and such that, in forming the second modification layer, a first modification layer formation region in which first ones of the multiple second internal modification layers are simultaneously formed at a second diametrical interval larger than the first diametrical interval and a second modification layer formation region in which second ones of the multiple second internal modification layers are simultaneously formed at a third diametrical interval smaller than the second diametrical interval are formed.

7. The processing apparatus of claim 2,
   wherein the second internal modification layer is formed in a spiral shape along the plane direction of the processing target object.

8. The processing apparatus of claim 2,
   wherein the second internal modification layer is formed in a ring shape along the plane direction of the processing target object to be concentric with the peripheral modification layer.

9. A processing method of processing a processing target object, comprising:
   in forming condensing points by radiating laser light periodically to an inside of the processing target object from a modifying device while rotating the processing target object held by a holder relatively to the modifying device by a rotating mechanism and, also, by moving the modifying device in a diametrical direction relative to the holder by a moving mechanism,
   controlling a number and an arrangement of the condensing points, which are simultaneously formed at different positions in the plane direction of the processing target object, based on a relative rotation number of the processing target object and a radiation pitch of the laser light.

10. The processing method of claim 9,
    wherein the condensing points formed within the processing target object form modification layers, and
    wherein the processing method comprises:
    forming a peripheral modification layer serving as a starting point where a peripheral portion of the processing target object as a removing target is detached;

forming a first internal modification layer in a ring shape to be concentric with the peripheral modification layer at a diametrically inner side than the peripheral modification layer; and forming a second internal modification layer at a diametrically inner side than the first internal modification layer, and wherein the forming of the first internal modification layer comprises forming multiple first internal modification layers simultaneously in the diametrical direction of the processing target object.

11. The processing method of claim 10, wherein the multiple first internal modification layers are simultaneously formed at a first diametrical interval along the diametrical direction of the processing target object, and the forming of the second internal modification layer comprises forming multiple second internal modification layers simultaneously at a second diametrical interval larger than the first diametrical interval along the diametrical direction of the processing target object.

12. The processing method of claim 10, wherein the multiple first internal modification layers are simultaneously formed at a first diametrical interval along the diametrical direction of the processing target object, and the forming of the second internal modification layer comprises forming multiple second internal modification layers simultaneously at the first diametrical interval along the diametrical direction of the processing target object.

13. The processing method of claim 10, wherein the second internal modification layer has multiple second internal modification layers, and the multiple second internal modification layers are simultaneously formed along a circumferential direction at a circumferential interval equal to a circumferential interval between the first internal modification layers formed in the processing target object.

14. The processing method of claim 10, wherein the multiple first internal modification layers are simultaneously formed at a first diametrical interval along the diametrical direction of the processing target object, the second internal modification layer has multiple second internal modification layers, and the forming of the second modification layer comprises forming a first modification layer formation region in which first ones of the multiple second internal modification layers are simultaneously formed at a second diametrical interval larger than the first diametrical interval and a second modification layer formation region in which second ones of the multiple second internal modification layers are simultaneously formed at a third diametrical interval smaller than the second diametrical interval.

15. The processing method of claim 10, wherein the forming of the second modification layer comprises:

forming the second internal modification layer in a spiral shape along the plane direction of the processing target object by radiating the laser light to the inside of the processing target object periodically from the modifying device while rotating the processing target object held by the holder relatively by the rotating mechanism and, also, by moving the modifying device in the diametrical direction relative to the holder by the moving mechanism.

16. The processing method of claim 10, wherein the forming of the second modification layer comprises:

forming the second internal modification layer in a ring shape to be concentric with the peripheral modification layer by radiating the laser light to the inside of the processing target object periodically from the modifying device while rotating the processing target object held by the holder relative to the modifying device;

moving the modifying device in the diametrical direction relative to the holder; and repeating the forming of the ring-shaped second internal modification layer and the moving of the modifying device in the diametrical direction to form the second internal modification layer in the ring shape along the plane direction of the processing target object to be concentric with the peripheral modification layer.

* * * * *